US009608309B2

(12) United States Patent
Wang et al.

(10) Patent No.: US 9,608,309 B2
(45) Date of Patent: Mar. 28, 2017

(54) MOBILE COMMUNICATION DEVICE

(71) Applicant: HTC Corporation, Taoyuan County (TW)

(72) Inventors: Ching-Sung Wang, Taoyuan County (TW); Chih-Hsien Wu, Taoyuan County (TW); Yu-Ju Yu, Taoyuan County (TW); Bing-Hsiao Wang, Taoyuan County (TW); Huang-Jen Chen, Taoyuan County (TW)

(73) Assignee: HTC CORPORATION, Taoyuan County (TW)

(*) Notice: Subject to any disclaimer, the term of this patent is extended or adjusted under 35 U.S.C. 154(b) by 766 days.

(21) Appl. No.: 13/672,719

(22) Filed: Nov. 9, 2012

(65) Prior Publication Data

US 2014/0132456 A1 May 15, 2014

(51) Int. Cl.

| | |
|---|---|
| ***H05K 5/02*** | (2006.01) |
| ***H01Q 1/24*** | (2006.01) |
| ***H01Q 1/48*** | (2006.01) |

(52) U.S. Cl.

CPC ............. *H01Q 1/243* (2013.01); *H01Q 1/242* (2013.01); *H01Q 1/48* (2013.01)

(58) Field of Classification Search

CPC .. G02F 1/133308; G02F 2001/133334; H05K 5/0221; H01R 4/64; H01R 2201/02; H01Q 1/243; H04M 1/0202

(Continued)

(56) References Cited

U.S. PATENT DOCUMENTS

2007/0025072 A1* 2/2007 Liao ...................... G06F 1/1616 361/679.21
2007/0117418 A1* 5/2007 Azuma et al. .................. 439/67

(Continued)

FOREIGN PATENT DOCUMENTS

| | | |
|---|---|---|
| CN | 2792119 | 6/2006 |
| CN | 102082330 | 6/2011 |
| TW | 201106528 | 2/2011 |

OTHER PUBLICATIONS

"Office Action of Taiwan Counterpart Application", issued on Apr. 13, 2015, p. 1-6, in which the listed references were cited.

(Continued)

*Primary Examiner* — Dameon E Levi
*Assistant Examiner* — David Lotter
(74) *Attorney, Agent, or Firm* — Jianq Chyun IP Office

(57) ABSTRACT

A mobile communication device is provided and includes a plastic frame body, a metal outer frame, a metal inner frame and a first conductive spring. The plastic frame body has an opening, a first locking groove, a first inserting groove and a first protrusive portion formed between the first locking groove and the first inserting groove. The metal outer frame is locked to the first locking groove and fixed on the outside of the plastic frame body. The metal inner frame is inserted into the first inserting groove and fixed in the surroundings of the opening of the plastic frame body. Besides, the metal inner frame is electrically connected to a system ground plane. The first conductive spring clasps the first protrusive portion. The first conductive spring extends into the first locking groove and the first inserting groove so as to electrically connect the metal outer and inner frames.

13 Claims, 6 Drawing Sheets

(58) Field of Classification Search
USPC .................. 343/702, 814; 361/732, 725, 726
See application file for complete search history.

(56) References Cited

U.S. PATENT DOCUMENTS

| | | | | |
|---|---|---|---|---|
| 2008/0316117 | A1* | 12/2008 | Hill et al. | 343/702 |
| 2009/0291709 | A1 | 11/2009 | Lee et al. | |
| 2010/0248655 | A1 | 9/2010 | Yahagi et al. | |
| 2011/0037662 | A1* | 2/2011 | Teng et al. | 343/702 |
| 2011/0124246 | A1* | 5/2011 | Ouyang | H04M 1/0277 439/862 |

OTHER PUBLICATIONS

"Office Action of China Counterpart Application", issued on Dec. 2, 2015, p. 1-7, in which the listed references were cited.

* cited by examiner

MOBILE COMMUNICATION DEVICE

TECHNICAL FIELD

The subject application relates to a mobile communication device, and particularly relates to a mobile communication device using a conductive spring to connect a metal inner frame and a metal outer frame.

BACKGROUND

Due to the trend of metallic design, mobile communication devices nowadays usually have a metal outer frame. In practice, the mobile communication devices further have a plastic frame body and a metal inner frame. To reduce the influence generated from the metal outer frame to the transmission quality of the mobile communication devices, the metal outer frame is usually connected to the metal inner frame, which is connected to the ground, via a conductive element. Furthermore, the connection impedance between the metal outer frame and the metal inner frame needs to be kept in a predetermined range to ensure that the influence generated from the metal outer frame on the mobile communication devices is reduced by the conductive element disposed.

For example, FIG. 1 is a structural schematic diagram of a plastic frame body of a conventional mobile communication device from the perspective that the display module of the mobile communication device faces the user. As shown in FIG. 1, an edge of a plastic frame body 110 has a plurality of apertures 121-124. When the conventional mobile devices are assembled, a metal outer frame (not shown) covers the plastic frame body 110 and is located at the left side of the apertures 121-124, and a metal inner frame (not shown) is mounted in the plastic frame body 110 and located at the right side of the apertures 121-124. Therefore, the plurality of apertures 121-124 are reserved in advance on the plastic frame body 110 in the conventional mobile communication device, such that conductive elements can be disposed in the apertures 121-124 (the conductive elements may not be disposed in all of the apertures), wherein the metal outer frame and the metal inner frame are electrically connected with each other via the conductive elements in the apertures 121-124.

However, in the configuration above, not only that a plurality of apertures have to be reserved on the plastic frame body 110 in advance, the conductive elements are embedded in the plastic frame body 110 and respectively covered by the metal outer frame and the metal inner frame. Namely, the plurality of apertures makes it more difficult to manufacture the plastic frame body 110. In addition, when the metal outer frame, the plastic frame body, and the metal inner frame are assembled, none of the conductive elements are exposed and all of the conductive elements are completely covered by the metal outer frame, the plastic frame body, and the metal inner frame. Moreover, during assembly, the conductive elements may be deformed or dislocated, rendering incomplete electrical connection that may not be told in the appearance after assembly.

Therefore, the testing personnel is not able to determine whether the electrical connection between the conductive elements and the metal inner/outer frames is complete, and fails to further detect the connection impedance between the metal inner frame and the metal outer frame. It should also be noted that since the mobile communication device usually has a plurality of conductive elements, when the connection impedance between the conductive elements and the metal inner/outer frames is abnormal, the testing personnel cannot determine which of the conductive elements induces the incomplete electrical connection. In other words, for the conventional mobile communication devices, the testing personnel cannot detect the connection impedance between the metal inner frame and the metal outer frame. Therefore, it cannot be determined whether the connection impedance between the metal inner frame and the metal outer frame is kept in a predetermined range.

SUMMARY

The subject application provides a mobile communication device using a conductive spring to connect a metal inner frame and a metal outer frame, wherein a portion of the conductive spring is exposed. In this way, the testing personnel may detect connection impedance between the metal inner frame and the metal outer frame with the exposed portion of the conductive spring.

The subject application provides a mobile communication device, including a plastic frame body, a metal outer frame, a metal inner frame, and a first conductive spring. The plastic frame body has an opening, a first locking groove, a first inserting groove, and a first protrusive portion between the first locking groove and the first inserting groove. The metal outer frame is locked to the first locking groove to be fixed on an outside of the plastic frame body. The metal inner frame is inserted into the first inserting groove to be fixed in surroundings of the opening of the plastic frame body. In addition, the metal inner frame is electrically connected to a system ground plane. The first conductive spring clasps the first protrusive portion and extends into the first locking groove and the first inserting groove, so as to be electrically connected with the metal outer frame and the metal inner frame respectively.

In an embodiment of the invention, the plastic frame body further includes a second locking groove, a second inserting groove, and a second protrusive portion between the second locking groove and the second inserting groove. In addition, the mobile communication device further includes a second conductive spring, wherein the second conductive spring clasps the second protrusive portion, and the second conductive spring extends into the second locking groove and the second inserting groove, so as to be electrically connected with the metal outer frame and the metal inner frame respectively.

In an embodiment of the invention, the first locking groove and the first inserting groove are located at a first side of the plastic frame body. In addition, the second locking groove and the second inserting groove are located at a second side of the plastic frame body, and the first side corresponds to the second side.

In an embodiment of the invention, the first conductive spring includes a clasp portion, a first elastic arm, and a second elastic arm. The clasp portion clasps the first protrusive portion. The first elastic arm is connected to the clasp portion and extends toward the first locking groove. The second elastic arm is connected to the clasp portion and extends toward the first inserting groove.

In an embodiment of the invention, the first locking groove has a first sidewall in a direction adjacent to the opening of the plastic frame body. The first inserting groove has a second sidewall in a direction away from the opening of the plastic frame body. In addition, the first protrusive portion is between the first sidewall and the second sidewall.

In an embodiment of the invention, the first conductive spring includes a first elastic arm, a second elastic arm, and a clasp portion connected between the first elastic arm and the second elastic arm. In addition, the clasp portion clasps the first protrusive portion. The first elastic arm is disposed between the metal outer frame and the first sidewall. The second elastic arm is disposed between the second sidewall and the metal inner frame.

In view of the foregoing, the locking groove and the inserting groove for fixing the metal outer frame and the metal inner frame are formed on the plastic frame body of the subject application, and the protrusive portion is disposed between the locking groove and the inserting grove. In this way, when the conductive spring is disposed on the protrusive portion by clasping, not only the conductive spring electrically connects the metal outer frame and the metal inner frame, but a portion of the conductive spring is exposed. Consequently, the testing personnel may detect connection impedance between the metal inner frame and the metal outer frame with the exposed portion of the conductive spring.

In order to make the aforementioned features and advantages of the subject application more comprehensible, embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
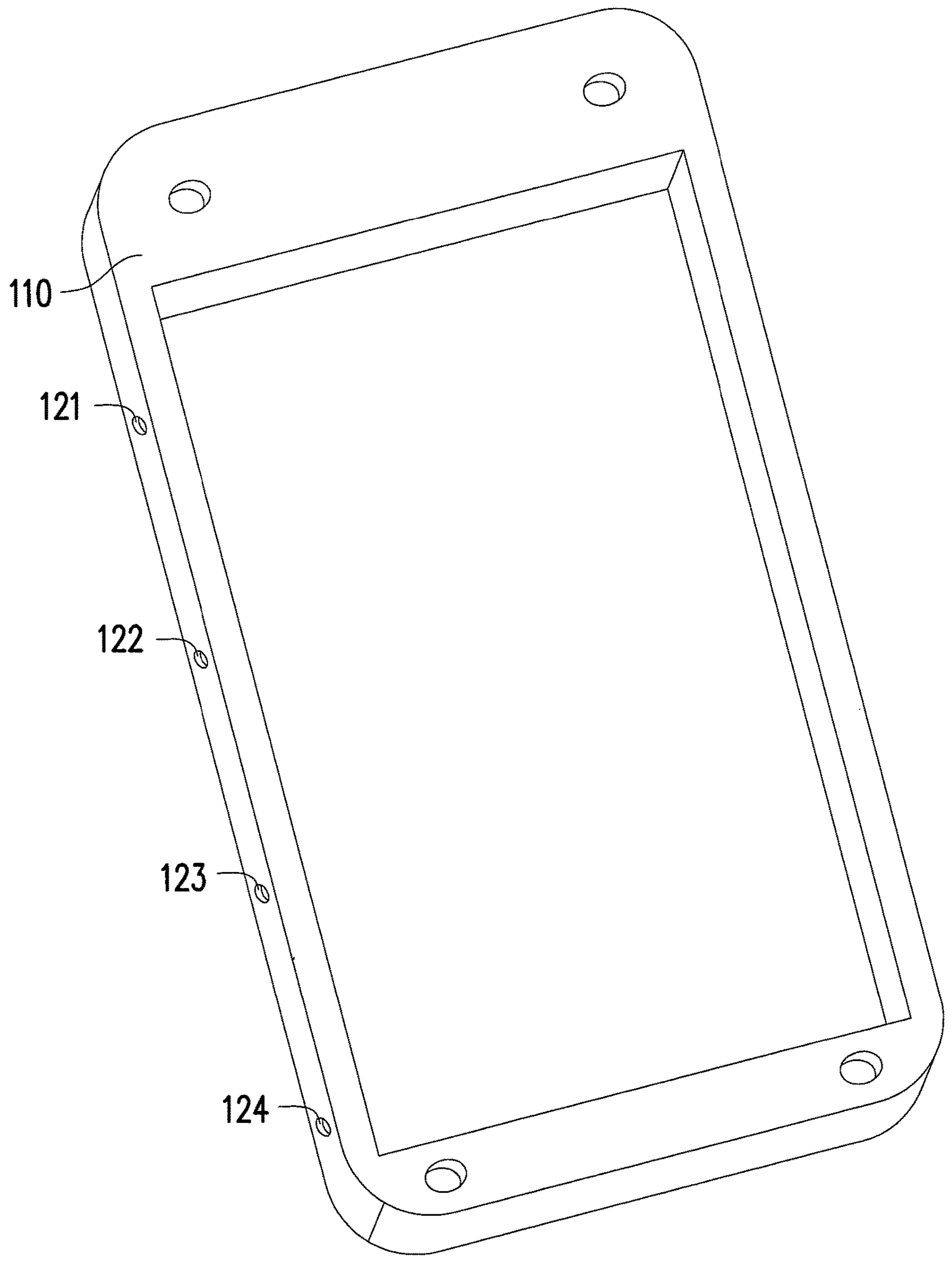
FIG. 1 (RELATED ART)
FIG. 1 is a structural schematic view of a plastic frame body of a conventional mobile communication device.
Figure 2:
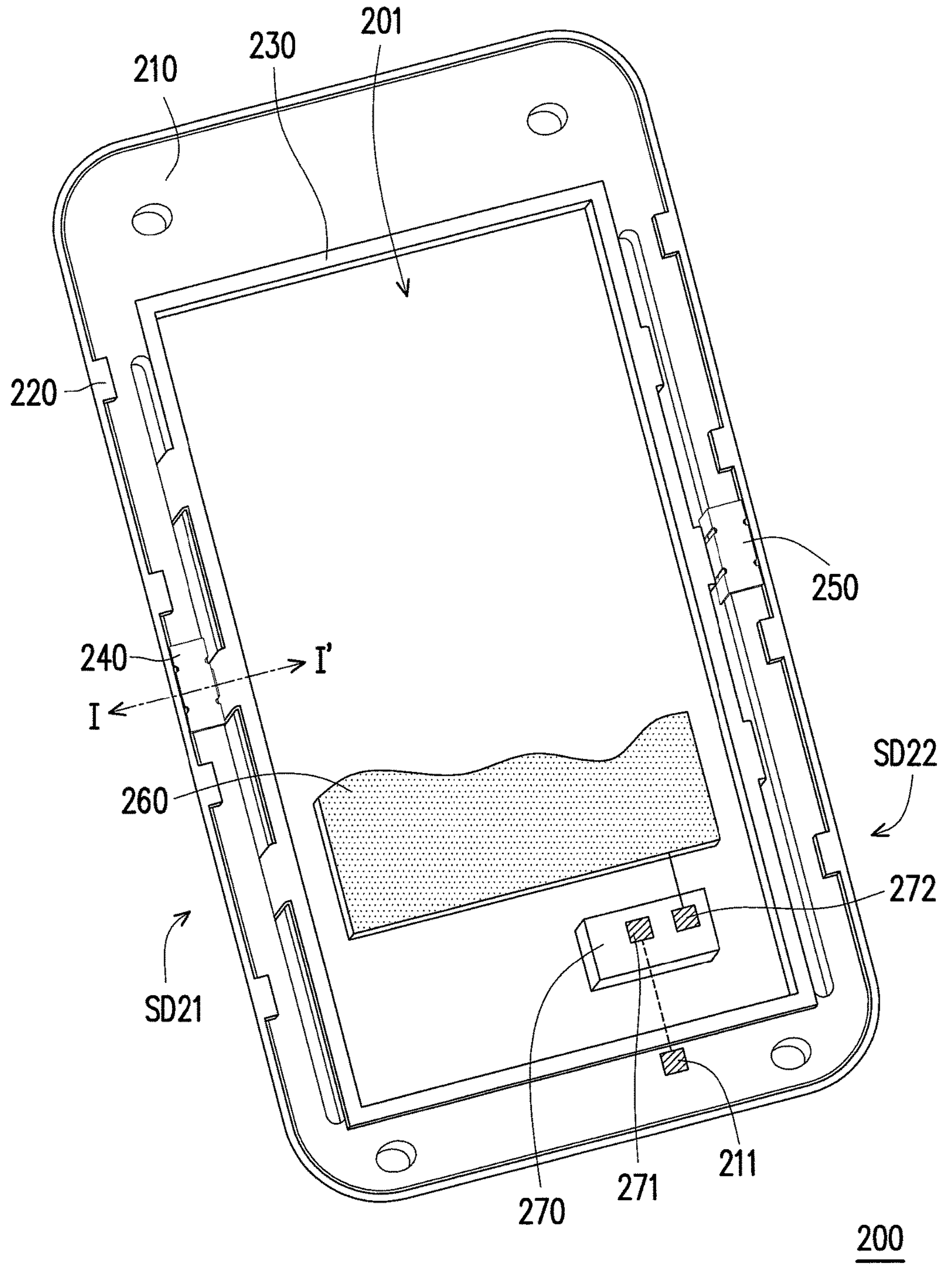
FIG. 2 is a schematic diagram illustrating a mobile communication device according to an exemplary embodiment of the invention.

FIG. 2 is a schematic diagram illustrating a mobile communication device according to an exemplary embodiment of the invention from a perspective that the user faces a back side of a display module of the mobile communication device. Referring to FIG. 2, a mobile communication device 200 includes a plastic frame body 210, a metal outer frame 220, a metal inner frame 230, a conductive spring 240, a conductive spring 250, a system ground plane 260 (usually disposed on a substrate), and an antenna module 270. The plastic frame body 210 has an opening 201 generally configured to contain the display module, a touch module, or a touch display module (not shown). The metal outer frame 220 is disposed on an outside of the plastic frame body 201, and the metal inner frame 230 is mounted in surroundings of the opening 201 of the plastic frame body 210. In other words, the metal outer frame 220 is opposite to the metal inner frame 230 with intervention of the plastic frame body 210.

It should be noted that the metal outer frame 220, the plastic frame body 210, and the metal inner frame 230 are parts of a housing of the mobile communication device 200. In addition, the housing of the mobile communication device 200 forms a space for accommodating necessary internal elements such as the system ground plane 260 and the antenna module 270, etc. For ease of illustration, disposed positions of the system ground plane 260 and the antenna module 270 in FIG. 2 are indicated relative to the plastic frame body 210 in the configuration.

With respect to operation, the antenna module 270 includes an antenna (not shown), such that the mobile communication device 200 may transceive an electromagnetic wave via the antenna module 270. In addition, the antenna module 270 includes a feeding point 271 and a ground point 272, wherein the mobile communication device 200 feeds a signal to the antenna of the antenna module 270 via the feeding point 271, so as to excite the antenna to radiate the electromagnetic wave. Besides, the antenna module 270 is electrically connected to the system ground plane 260 via the ground point 272. To prevent the metal outer frame 220 from influencing properties of receiving or radiating the electromagnetic wave of the antenna module 270, the metal inner frame 230 is electrically connected to the system ground plane 260, and the metal outer frame 220 is electrically connected to the metal inner frame 230 via at least the conductive spring 240 and the conductive spring 250, wherein it is not limited to use a conductive spring to electrically connect the metal outer frame 220 to the metal inner frame 230. Any conductive element with conductivity falls into the protection scope of the subject application.

Figure 3:
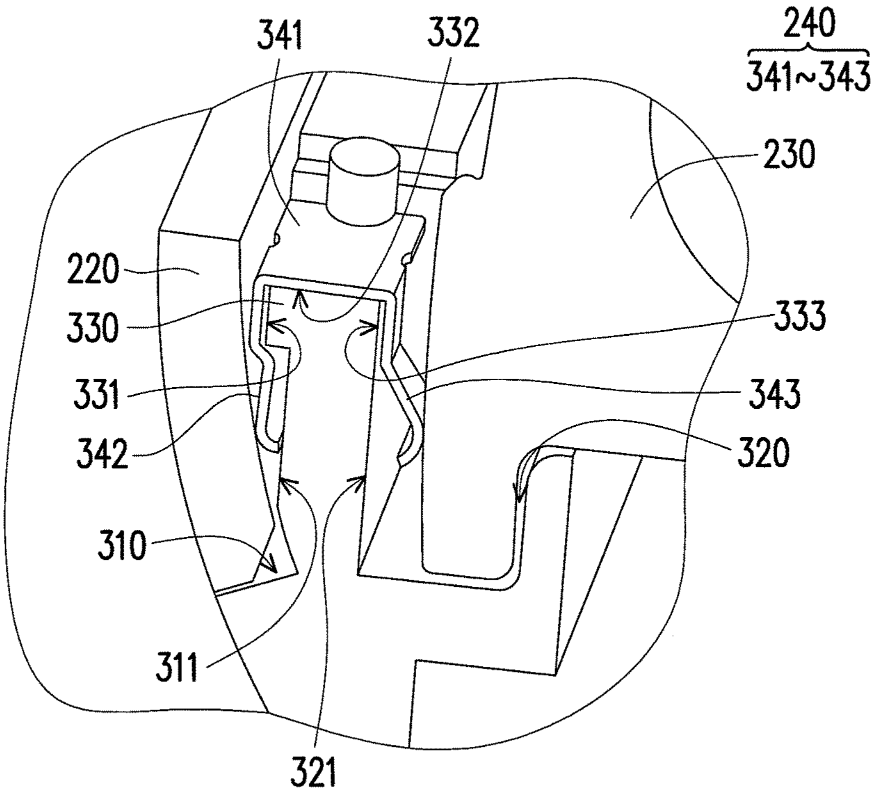
FIG. 3 is a cross-sectional view along line I-I' in FIG. 2.

FIG. 3 is a cross-sectional view along line I-I' in FIG. 2. Referring to FIG. 3 for the structure and configuration of the plastic frame body 210, the metal outer frame 220, the metal inner frame 230, and the conductive spring 240 in practice, the plastic frame body 210 includes a locking groove 310, an inserting groove 320, and a protrusive portion 330, wherein the protrusive portion 330 is disposed between the locking groove 310 and the inserting groove 320, as shown in FIG. 3. For example, the locking groove 310 has a sidewall 311 in a direction adjacent to the opening 201 of the plastic frame body 210, the inserting groove 320 has a sidewall 321 in a direction away from the opening 201, and the protrusive portion 330 is disposed between the sidewalls 311 and 321.

Figure 4:
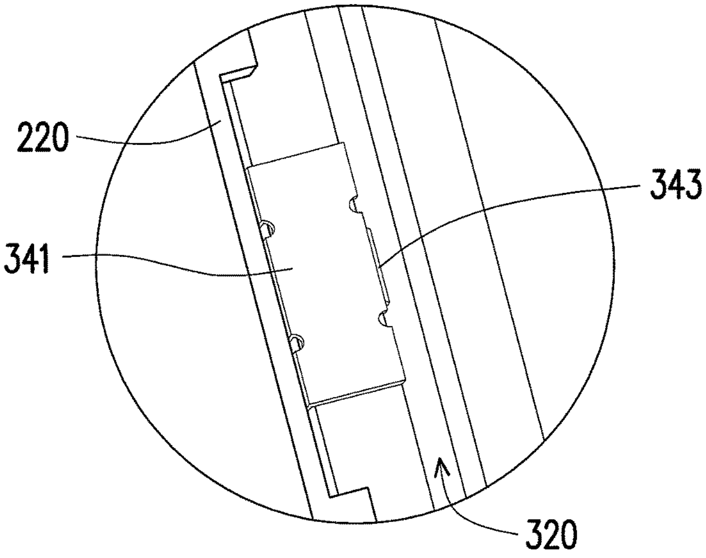
FIG. 4 is a partial enlarged view illustrating a plastic frame body and a metal external frame according to an exemplary embodiment of the invention.

FIG. 4 is a partial enlarged view illustrating a plastic frame body and a metal external frame according to an exemplary embodiment of the invention. As shown in FIG. 4, the inserting groove 320 extends along an edge of the plastic frame body 210. Similarly, the locking groove 310 also extends along the edge of the plastic frame body 210. Therefore, in the overall configuration, the mobile communication device 200 may fix the metal outer frame 220 and the metal inner frame 230 on the plastic frame body 210 via the locking groove 310 and the inserting groove 320. For example, the metal outer frame 220 is locked to the locking groove 310 in order to be fixed on the outside of the plastic frame body 210 in practice. The metal inner frame 230 is inserted into the inserting groove 320 in order to be fixed in the surroundings of the opening 201 of the plastic frame body 210.

Still referring to FIG. 3, the conductive spring 240 clasps the protrusive portion 330, and the conductive spring 240 extends into the locking groove 310 and the inserting groove 320 respectively. For example, the conductive spring 240 includes a clasp portion 341, a first elastic arm 342, and a second elastic arm 343, wherein the clasp portion 341 clasps the protrusive portion 330. In addition, the first elastic arm 342 is connected with the clasp portion 341 and extends toward the locking groove 310. The second elastic arm 343 is connected with the clasp portion 341 and extends toward the inserting groove 320. Thereby, the first elastic arm 342 is disposed between the metal outer frame 220 and the sidewall 311 of the locking groove 310, so as to be electrically connected with the metal outer frame 220. Similarly, the second elastic arm 343 is disposed between the sidewall 321 of the inserting groove 320 and the metal inner frame 230, so as to be electrically connected with the metal inner frame 230. In other words, the conductive spring 240 extending to the locking groove 310 and the inserting groove 320 is respectively electrically connected with the metal outer frame 220 and the metal inner frame 230.

Referring to FIGS. 2 and 3 simultaneously, the locking groove 310 and the inserting groove 320 are located at a first side SD21 of the plastic frame body 210. Therefore, the conductive spring 240 may be fixed at the protrusive portion 330 at the first side SD21 of the plastic frame body 210. In other words, the conductive spring 240 is disposed at the first side SD21 of the plastic frame body 210. Moreover, the conductive spring 250 is disposed at a second side SD22 of the plastic frame body 210, and a structure and configuration of the conductive spring 250 are identical to the conductive spring 240. Namely, the second side SD22 of the plastic frame body 210 also has a locking groove, an inserting groove, and a protrusive portion disposed between the locking groove and the inserting groove. Moreover, the conductive spring 250 clasps the protrusive portion at the second side SD22 and extends into the locking groove and the inserting groove at the second side SD22 respectively, so as to electrically connect to the metal outer frame 220 and the metal inner frame 230. Similarly, the metal outer frame 220 is also locked to the locking groove at the second side SD22, and the metal inner frame 230 is also inserted into the inserting groove at the second side SD 22. In addition, a detailed structure of the conductive spring 250 and a detailed structure of the conductive spring 240 are identical, so no further details are reiterated hereinafter.

Figure 5:
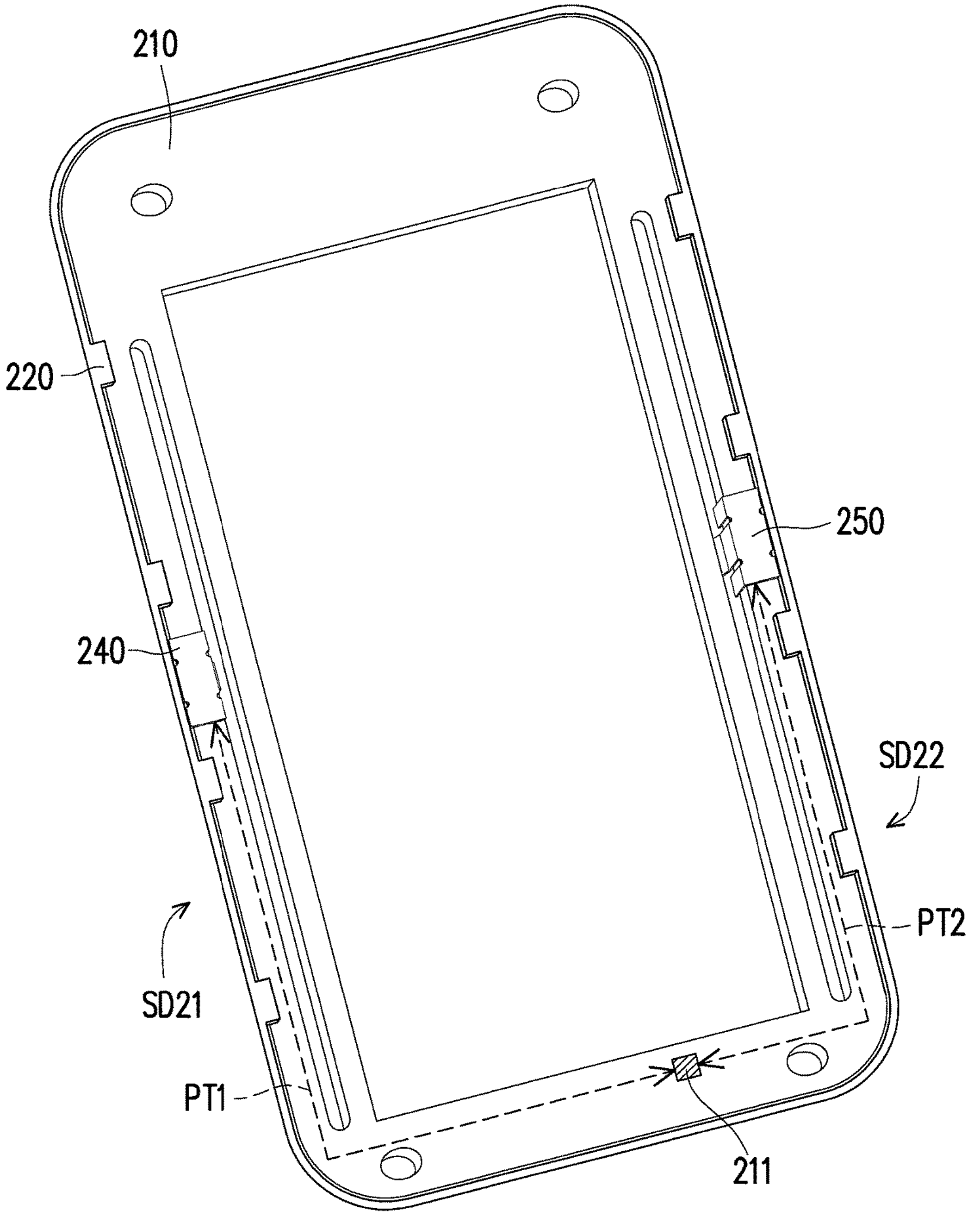
FIG. 5 is a structural schematic view illustrating a plastic frame body, a metal external frame, and a conductive spring according to an exemplary embodiment of the invention.

Still referring to FIG. 2, in practice, the antenna module 270 and the plastic frame body 210 are partially overlapped on a vertical plane of projection. Therefore, the plastic frame body 210 includes a projected feeding point 211, which is a relative position at which the feeding point 271 of the antenna module 270 is vertically projected on the plastic frame body 210. Namely, the projected feeding point 211 corresponds to the feeding point 271 of the antenna module 270. In addition, FIG. 5 is a structural schematic view illustrating a plastic frame body, a metal external frame, and a conductive spring according to an exemplary embodiment of the invention. As shown in FIG. 5, the plastic frame body 210 further includes a first path PT1 and a second path PT2, wherein the first path PT1 extends from the projected feeding point 211 to the conductive spring 240 along a predetermined direction (e.g. clockwise direction), and the second path PT2 extends from the projected feeding point 211 to the conductive spring 250 along an opposite direction (e.g. counter-clockwise direction) of the predetermined direction. In addition, in practice, a ratio between a length of the first path PT1 and a length of the second path PT2 may be, for example, 1.36.

It should be noted that the metal outer frame 220 may be electrically connected to the system ground plane 260 by disposing the conductive springs 240 and 250. In addition, the conductive springs 240 and 250 cover a portion of a surface of each of the protrusive portions through clasping. For example, as shown in FIG. 3, the clasp portion 341 of the conductive spring 240 is in a "⊓" shape, and covers surfaces 331 to 333 of the protrusive portion 330 through clasping. In this way, when the metal outer frame 220, the plastic frame body 210, and the metal inner frame 230 are assembled, the conductive springs 240 and 250 covering over the surface 332 of the protrusive portion 330 are still exposed, wherein the metal outer frame 220, the plastic frame body 210, and the metal inner frame 230 only cover a portion of the conductive springs 240 and 250.

Thereby, the testing personnel may use an exposed portion of the conductive spring 240 to test whether electrical connection between the conductive spring 240 and the metal inner frame 230 is complete and whether electrical connection between the conductive spring 240 and the metal outer frame 220 is complete. Similarly, a portion of the conductive spring 250 may also be exposed, such that testing personnel may test respective connection states of the conductive spring 250 with the metal inner frame 230 and the metal outer frame 220. In other words, with the exposed portions of the conductive springs 240 and 250, the testing personnel may detect connection impedance between the metal inner frame 230 and the metal outer frame 240.

Moreover, since the conductive springs 240 and 250 are disposed on the protrusive portion through clasping, the testing personnel may simply replace the conductive spring with another conductive spring when a detecting result of connection impedance is not preferable. Thereby, the connection impedance between the metal inner frame 230 and the metal outer frame 220 may be controlled in a predetermined range. In this way, by disposing the conductive springs 240 and 250, double grounds may be formed on the metal outer frame 220. In addition, with a structural design of double grounds, a resonance mode generated by the metal outer frame 220 may be excluded from an operating band of the antenna module 270. Namely, the destructive resonance mode generated by the outer metal frame 220 does not influence the operation of the antenna module 270, and an influence of the metal outer frame 220 on a transmission quality of the mobile communication device 200 is eliminated.

In other words, the embodiment illustrated in FIG. 2 makes use of the conductive springs 240 and 250 to form the metal outer frame 220 with double grounds, and makes use of the structural design of double grounds to adjust the resonance mode of the metal outer frame 220 to the non-operating band of the antenna module 270. However, in response to different operating bands, the mobile communication device 200 may use the outer metal frame 220 with a single ground to adjust the resonance mode of the outer metal frame 220 to another band not in use for the application in practice. This is to say that people having ordinary skill in the art may dispose only the conductive spring 240 or the conductive spring 250 in the mobile communication device 200.

It should be noted that in the embodiment of FIG. 2, the first path PT1 and the second path PT2 on the plastic frame body 210 are determined based on the conductive spring 240, the conductive spring 250, and the projected feeding point 211. However, when the mobile communication device 200 is only disposed with one single conductive spring (e.g. the conductive spring 240 or 250), the single conductive spring and the projected feeding point 211 may also be used to determine the first path PT1 and the second path PT2, thereby adjusting the single ground on the frame 220 to an appropriate position through adjustment to the first path PT1 and the second path PT2.

Figure 6:
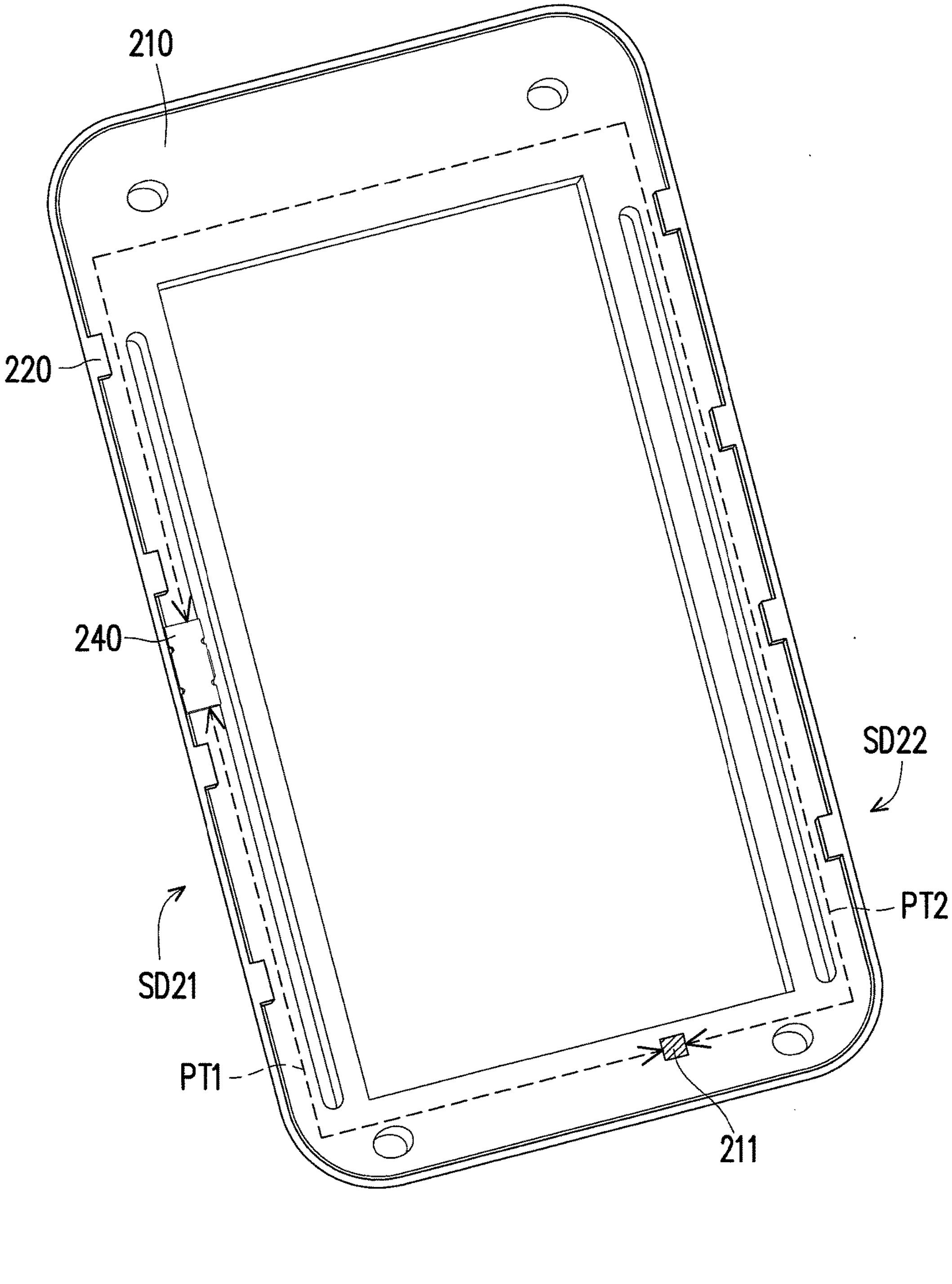
FIGS. 6 and 7 are respectively structural schematic views illustrating a plastic frame body, a metal external frame, and a conductive spring according to another embodiment of the invention.
Figure 7:
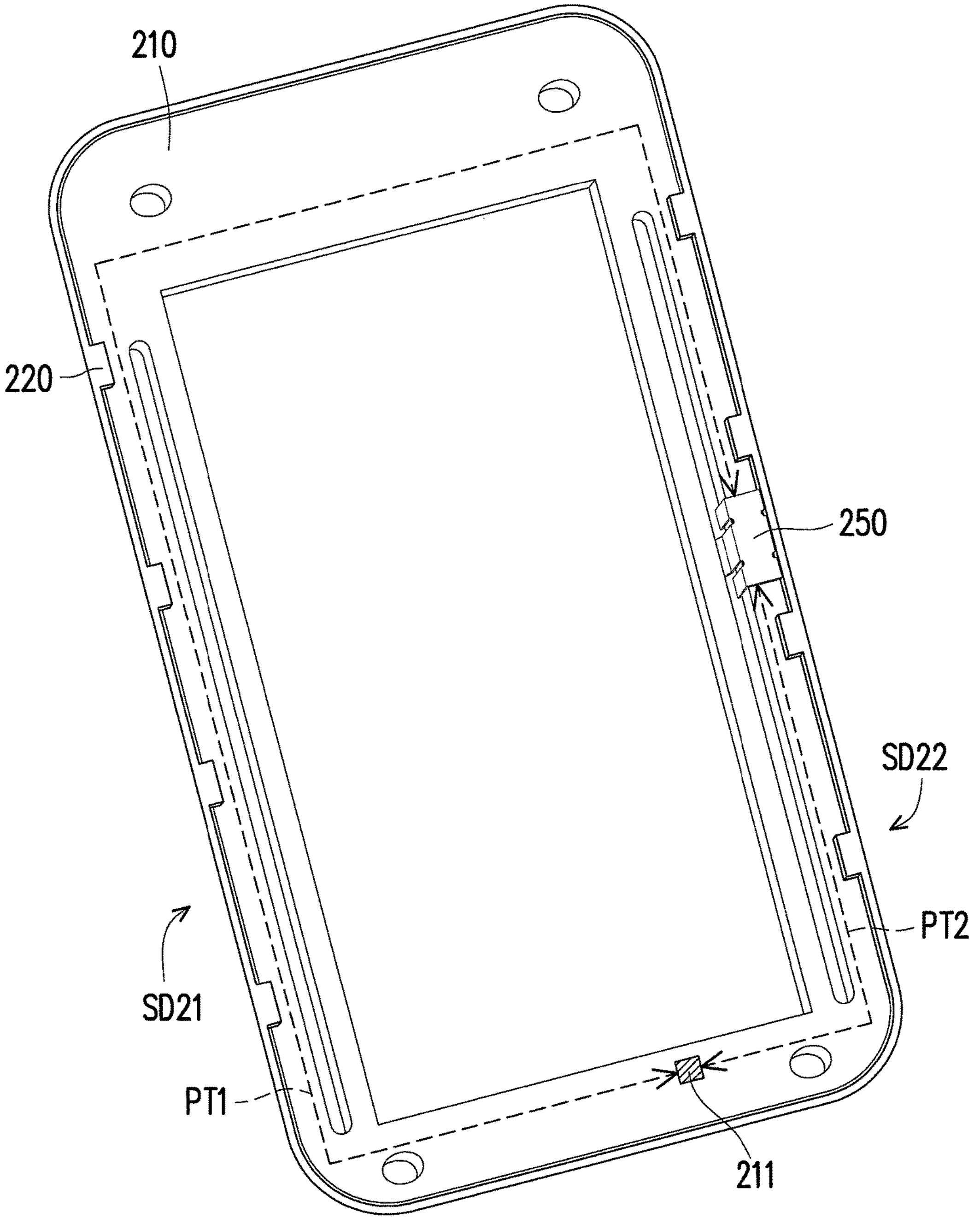

For example, FIGS. 6 and 7 are respectively structural schematic views illustrating the plastic frame body 210, the metal external frame 220, and the conductive spring 240 according to another embodiment of the invention. As shown in FIG. 6, when the mobile communication device 200 is only disposed with the conductive spring 240, the first path PT1 extends from the projected feeding point 211 to the conductive spring 240 along a predetermined direction (e.g. clockwise direction), and the second path PT2 extends from the projected feeding point 211 to the conductive spring 240 along an opposite direction (e.g. counter-clockwise direction) of the predetermined direction. In addition, in practice, a ratio between the length of the first path PT1 and the length of the second path PT2 may be, for example, 0.38 at this time.

Also, as shown in FIG. 7, when the mobile communication device 200 is only disposed with the conductive spring 250, the first path PT1 extends from the projected feeding point 211 to the conductive spring 250 along a predetermined direction (e.g. clockwise direction), and the second path PT2 extends from the projected feeding point 211 to the conductive spring 250 along an opposite direction (e.g. counter-clockwise direction) of the predetermined direction. In addition, in practice, a ratio between the length of the first path PT1 and the length of the second path PT2 may be, for example, 3.95 at this time.

In view of the foregoing, the locking groove and the inserting groove for fixing the metal outer frame and the metal inner frame are formed on the plastic frame body of the subject application, and the protrusive portion is disposed between the locking groove and the inserting grove. In this way, when the conductive spring is disposed on the protrusive portion by clasping, not only the conductive spring electrically connects the metal outer frame and the metal inner frame, but a portion of the conductive spring is exposed. Thereby, the testing personnel may test the connection impedance between the metal outer frame and the metal inner frame with the exposed portion of the conductive spring, and control the connection impedance within a predetermined range. Moreover, the testing personnel may immediately replace or adjust the conductive spring when finding that the conductive spring is deformed or dislocated during assembly, so as to maintain a preferable electrical connection. Compared to the conventional design, wherein the conductive element cannot be found in the appearance after assembly is completed, the embodiment of the subject application is indeed advantageous. In this configuration, it is ensured that the resonance mode of the metal outer frame is shift out of the operating band, which is helpful in improving the transmission quality of the mobile communication device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A mobile communication device, comprising:

a plastic frame body, having an opening, a first locking groove, a first inserting groove, and a first protrusive portion between the first locking groove and the first inserting groove;

a metal outer frame, wherein an ending edge of the metal outer frame is inserted in and locked to the first locking groove to be fixed on an outside of the plastic frame body;

a metal inner frame, wherein an ending edge of the metal inner frame is inserted into the first inserting groove to be fixed in surroundings of the opening of the plastic frame body, wherein the metal inner frame is electrically connected to a system ground plane; and a first conductive spring, clasping the first protrusive portion and extending into the first locking groove and the first inserting groove, so as to be electrically connected with the metal outer frame and the metal inner frame respectively.

2. The mobile communication device as claimed in claim 1, further comprising:

an antenna module, transceiving an electromagnetic wave and having a feeding point, wherein the plastic frame body comprises a projected feeding point corresponding to the feeding point, a first path, and a second path, the first path extending from the projected feeding point to the first conductive spring along a predetermined direction, and the second path extending from the projected feeding point to the first conductive spring along an opposite direction of the predetermined direction.

3. The mobile communication device as claimed in claim 2, wherein a ratio between the first path and the second path is 0.38.

4. The mobile communication device as claimed in claim 2, wherein a ratio between the first path and the second path is 3.95.

5. The mobile communication device as claimed in claim 1, wherein the plastic frame body further comprises a second locking groove, a second inserting groove, and a second protrusive portion between the second locking groove and the second inserting groove, and the mobile communication device further comprises a second conductive spring, wherein the second conductive spring clasps the second protrusive portion, and the second conductive spring extends into the second locking groove and the second inserting groove, so as to be electrically connected with the metal outer frame and the metal inner frame respectively.

6. The mobile communication device as claimed in claim 5, further comprising:

an antenna module, transceiving an electromagnetic wave and having a feeding point, wherein the plastic frame body comprises a projected feeding point corresponding to the feeding point, a first path, and a second path, the first path extending from the projected feeding point to the first conductive spring along a predetermined direction, and the second path extending from the projected feeding point to the second conductive spring along an opposite direction of the predetermined direction.

7. The mobile communication device as claimed in claim 6, wherein a ratio between the first path and the second path is 1.36.

8. The mobile communication device as claimed in claim 6, wherein the first locking groove and the first inserting groove are located at a first side of the plastic frame body, the second locking groove and the second inserting groove are located at a second side of the plastic frame body, and the first side opposite to the second side.

9. The mobile communication device as claimed in claim 1, wherein the first conductive spring comprises:

a clasp portion, clasping the first protrusive portion;

a first elastic arm, connected to the clasp portion and extending toward the first locking groove; and a second elastic arm, connected to the clasp portion and extending toward the first inserting groove.

10. The mobile communication device as claimed in claim 1, wherein the first locking groove has a first sidewall in a direction adjacent to the opening of the plastic frame body, the first inserting groove has a second sidewall in a direction away from the opening of the plastic frame body, and the first protrusive portion is between the first sidewall and the second sidewall.

11. The mobile communication device as claimed in claim 10, wherein the first conductive spring comprises a first elastic arm, a second elastic arm, and a clasp portion connected between the first elastic arm and the second elastic arm, wherein the clasp portion clasps the first protrusive portion, the first elastic arm is disposed between the metal outer frame and the first sidewall, and the second elastic arm is disposed between the second sidewall and the metal inner frame.

12. The mobile communication device as claimed in claim 1, wherein when the metal outer frame and the metal inner frame are locked to the plastic frame body, the metal outer frame, the plastic frame body, and the metal inner frame expose a portion of the first conductive spring.

13. The mobile communication device as claimed in claim 5, wherein when the metal outer frame and the metal inner frame are locked to the plastic frame body, the metal outer frame, the plastic frame body, and the metal inner frame expose a portion of the second conductive spring.

* * * * *